(12) United States Patent
Couillard

(10) Patent No.: US 8,062,956 B2
Couillard
(45) Date of Patent: Nov. 22, 2011

(54) SEMICONDUCTOR ON INSULATOR AND METHODS OF FORMING SAME USING TEMPERATURE GRADIENT IN AN ANODIC BONDING PROCESS

(75) Inventor: James Gregory Couillard, Ithaca, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 12/547,522

(22) Filed: Aug. 26, 2009

(65) Prior Publication Data

US 2011/0053344 A1   Mar. 3, 2011

(51) Int. Cl.
*H01L 21/30* (2006.01)

(52) U.S. Cl. .......... 438/455; 438/458; 257/E21.088; 257/E21.122; 257/E21.568; 257/E27.137; 257/E27.144; 257/E21.161

(58) Field of Classification Search .......... None
See application file for complete search history.

(56) References Cited

U.S. PATENT DOCUMENTS

| | | | |
|---|---|---|---|
| 5,673,476 A | 10/1997 | Akaike et al. ............ 29/825 |
| 7,176,528 B2 | 2/2007 | Couillard et al. ......... 257/347 |
| 7,192,844 B2 | 3/2007 | Couillard et al. ......... 438/458 |
| 7,399,681 B2 | 7/2008 | Couillard et al. ......... 438/458 |
| 7,476,940 B2 | 1/2009 | Couillard et al. ......... 257/347 |
| 2005/0255670 A1* | 11/2005 | Couillard et al. ......... 438/455 |
| 2007/0246450 A1 | 10/2007 | Cady et al. ............. 219/250 |
| 2007/0281399 A1 | 12/2007 | Cites et al. ............. 438/149 |

FOREIGN PATENT DOCUMENTS

| JP | 2001-010847 A | * | 1/2001 |
|---|---|---|---|
| WO | WO 2006/023289 | | 3/2006 |

OTHER PUBLICATIONS

Incropera et al. ("Introduction to Heat Transfer", John Wiley and Sons, 4th edition, section 1.3.2, pp. 21-24, 2002).*

* cited by examiner

*Primary Examiner* — Charles Garber
*Assistant Examiner* — Yasser A Abdelaziez
(74) *Attorney, Agent, or Firm* — Matthew J. Mason

(57) ABSTRACT

Methods and apparatus for producing a semiconductor on glass (SOG) structure include: bringing a first surface of a glass substrate into direct or indirect contact with a semiconductor wafer; heating at least one of the glass substrate and the semiconductor wafer such that a second surface of the glass substrate, opposite to the first surface thereof, is at a lower temperature than the first surface; applying a voltage potential across the glass substrate and the semiconductor wafer; and maintaining the contact, heating and voltage to induce an anodic bond between the semiconductor wafer and the glass substrate via electrolysis.

9 Claims, 3 Drawing Sheets

SEMICONDUCTOR ON INSULATOR AND METHODS OF FORMING SAME USING TEMPERATURE GRADIENT IN AN ANODIC BONDING PROCESS

BACKGROUND

The present invention relates to the manufacture of a semiconductor-on-insulator (SOI) structure using an improved anodic bonding process.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, and displays, such as active matrix displays. SOI structures may include a thin layer of substantially single crystal silicon on an insulating material.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

Manufacture of SOI structures by these methods is costly. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 7,176,528 discloses a process that produces an SiOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; (iv) cooling the structure to a common temperature; and (v) separating the glass substrate and a thin layer of silicon from the silicon wafer.

Although the manufacturing processes for making SOI structures is maturing, the performance of final products employing them is limited by the properties of the semiconductor material and the insulating substrate. Accordingly, it is desirable to continue to advance the physical, electrical, thermal, and optic characteristics (as well as other characteristics) of the SOI structures.

SUMMARY

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, semiconductor-on-glass (SOG) structures, silicon-on-insulator (SOI) structures, and silicon-on-glass (SiOG) structures, which also encompasses silicon-on-glass-ceramic structures.

With reference to FIG. 1, when using the process of U.S. Pat. No. 7,176,528 to form an SOG structure 100, both the glass substrate 102 and the semiconductor donor wafer (not shown, but from which the semiconductor layer 104 is obtained) are heated to temperatures above 300° C. This increases the ion mobility within the glass substrate 102, which is required for anodic bonding and barrier layer formation. The glass may be heated to a temperature of about 575-600° C., approximately 50° C. less than the strain point of the glass.

With reference to FIG. 2, it has been discovered that particle precipitates form on the back surface 106 of the glass substrate 102, which is undesirable for many applications such as flat panel displays. Analysis of the particles indicates they are compromised largely of tramp sodium from the glass substrate 102. FIG. 2 shows such particles via an optical microscope image (50×) of the back surface 106 of the SOG 100 after anodic bonding using the above-discussed SOG fabrication process in which the donor semiconductor wafer was taken to a temperature of about 525° C. and the glass substrate 102 was taken to a temperature of about 575° C.

The sodium precipitates on the back surface 106 of the glass substrate 102 because it is highly mobile within the glass and is subjected to a driving force (voltage). The level of backside particles may be reduced by either reducing the sodium mobility or the applied driving force. The driving force may be unintentionally concentrated at microscopic features of whatever mechanical system is used to apply a voltage potential to the back surface 106 of the glass substrate 102, such as an electrode of a bonder apparatus. These microscopic features act in a way akin to lightning rods, producing high electric fields and thus attracting high local concentrations of sodium. Smoothing the surface of the electrode has been shown to reduce but not eliminate the particles. Eliminating the driving force (i.e., thermal bonding without voltage) is not preferred as anodic bonding provides greater bond strength between the semiconductor material and the glass substrate, as well as creating an in situ barrier layer, which provides product advantages.

The particles may be partially removed by wet chemical cleaning after bonding, but this leaves pits in the glass substrate 102 which are equally undesirable.

Embodiments disclosed herein reduce the levels of backside particles by modifying the temperatures used during anodic bonding. For example, during the anodic bonding process, the backside 106 of the glass substrate 102 (opposite to the semiconductor donor wafer-to-glass interface) is kept at a relatively low temperature, as low as possible while still allowing ionic conduction. The level of such temperature will vary by glass type and characteristics. By limiting the temperature imposed on the backside 106 of the glass substrate 102, and thus ion mobility, the ability of tramp sodium in the glass to escape and form precipitates is reduced. The front side of the glass substrate (which directly or indirectly contacts the semiconductor donor wafer) may be heated to higher temperatures, which reduces cycle time and increases ion mobility at the semiconductor-glass interface (as compared with the lower temperatures of the backside of the glass substrate). The resulting SOG structure will have greatly reduced particles on the back surface of the glass substrate while not compromising the other product attributes.

In accordance with one or more embodiments disclosed herein, methods and apparatus of forming a semiconductor on glass structure, include: bringing a first surface of a glass substrate into direct or indirect contact with a semiconductor wafer; heating at least one of the glass substrate and the semiconductor wafer such that a second surface of the glass substrate, opposite to the first surface thereof, is at a lower temperature than the first surface; applying a voltage potential across the glass substrate and the semiconductor wafer; and maintaining the contact, heating and voltage to induce an anodic bond between the semiconductor wafer and the glass substrate via electrolysis.

The heating step may include heating at least one of the glass substrate and the semiconductor wafer such that the second surface of the glass substrate is at temperature at least 50° C. lower than the temperature of the first surface of the glass substrate, such as between about 50° C. to about 150° C. lower than the temperature of the first surface.

The heating step may also include heating a junction of the first surface of a glass substrate and the semiconductor wafer to a temperature between about +/−350° C. of a strain point of the glass substrate, such as between about −250° C. and 0° C. of a strain point of the glass substrate, or between about −100° C. and −50° C. of a strain point of the glass substrate.

The advantages of the embodiments disclosed herein are best understood after reading the detailed technical description herein. The primary advantages include: improved optical performance, elimination of SOG manufacturing process steps, reduced contamination in post bonding fabrication processes, and simplified process equipment. Particles on the order of one micrometer or larger are visible to the naked eye, and thus are undesirable for some applications, such as flat panel displays. Reducing the particle count and/or size in an SOG structure improves the usefulness in such applications. By minimizing or eliminating the backside particles, any cleaning steps used for removal of such particles after bonding may be altered or potentially omitted. This reduces process costs and increases throughput. Since trace amounts of sodium present within the glass substrate may cause reduced performance in some thin film electronics devices, a process which reduces surface sodium on the glass substrate is desirable. The semiconductor donor wafer and glass substrate stack may be heated on only one side during anodic bonding, which may simplify the bonding equipment and reduce capital and maintenance costs.

Other aspects, features, advantages, etc. will become apparent to one skilled in the art when the description herein is taken in conjunction with the accompanying drawings.

BRIEF DESCRIPTION OF THE DRAWINGS

For the purposes of illustrating the various features disclosed herein, there are shown in the drawings forms that are presently preferred, it being understood, however, that the invention is not limited to the precise arrangements and instrumentalities shown.

DETAILED DESCRIPTION

Figure 1:
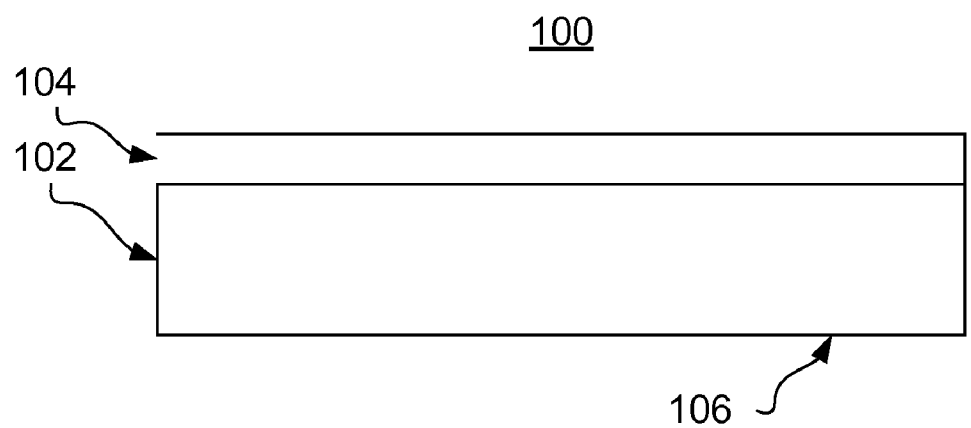
FIG. 1 is a block diagram illustrating the structure of an SOG device in accordance with one or more embodiments disclosed herein.
Figure 2:
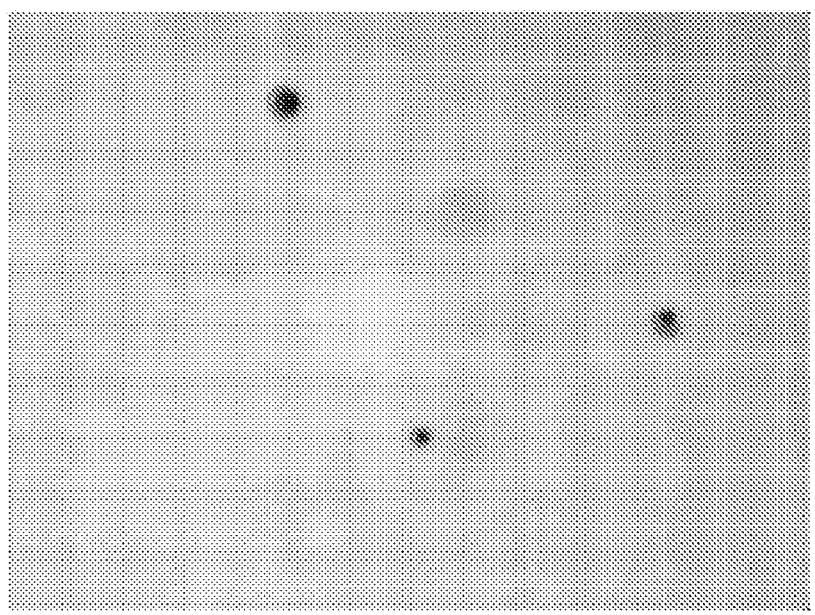
FIG. 2 is an illustration of a backside of the glass substrate of an SOG on which particle precipitates (largely tramp sodium) have formed.

With reference to the drawings, wherein like numerals indicate like elements, there is shown in FIG. 1 an SOG structure 100 in accordance with one or more embodiments disclosed herein. The SOG structure 100 may include a glass substrate 102, and a semiconductor layer 104. The SOG structure 100 has suitable uses in connection with fabricating thin film transistors (TFTs), e.g., for display applications, including organic light-emitting diode (OLED) displays and liquid crystal displays (LCDs), integrated circuits, photovoltaic devices, etc.

The semiconductor material of the layer 104 may be in the form of a substantially single-crystal material. The term "substantially" is used in describing the layer 104 to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 may be formed from an oxide glass or an oxide glass-ceramic. Although not required, the embodiments described herein may include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses may have the advantage of being simpler to manufacture, thus making them more widely available and less expensive.

By way of example, the glass substrate 102 may be formed from glass substrates containing alkaline-earth ions, such as, substrates made of Corning Incorporated Code 1737 glass or Corning Incorporated EAGLE 2000® glass substrates. These glass materials have particular use in, for example, the production of liquid crystal displays.

The glass substrate may have a thickness in the range of about 0.1 mm to about 10 mm, such as in the range of about 0.5 mm to about 3 mm. For some SOG structures, insulating layers having a thickness greater than or equal to about 1 micron are desirable, e.g., to avoid parasitic capacitive effects which arise when standard SOG structures having a silicon/silicon dioxide/silicon configuration are operated at high frequencies. In the past, such thicknesses have been difficult to achieve. In accordance with the present invention, an SOG structure having an insulating layer thicker than about 1 micron is readily achieved by simply using a glass substrate 102 having a thickness that is greater than or equal to about 1 micron. A lower limit on the thickness of the glass substrate 102 may be about 1 micron.

In general, the glass substrate 102 should be thick enough to support the semiconductor layer 104 through the bonding process steps, as well as subsequent processing performed on the SiOG structure 100. Although there is no theoretical upper limit on the thickness of the glass substrate 102, a thickness beyond that needed for the support function or that desired for the ultimate SOG structure 100 might not be advantageous since the greater the thickness of the glass substrate 102, the more difficult it will be to accomplish at least some of the process steps in forming the SOG structure 100.

Figure 3:
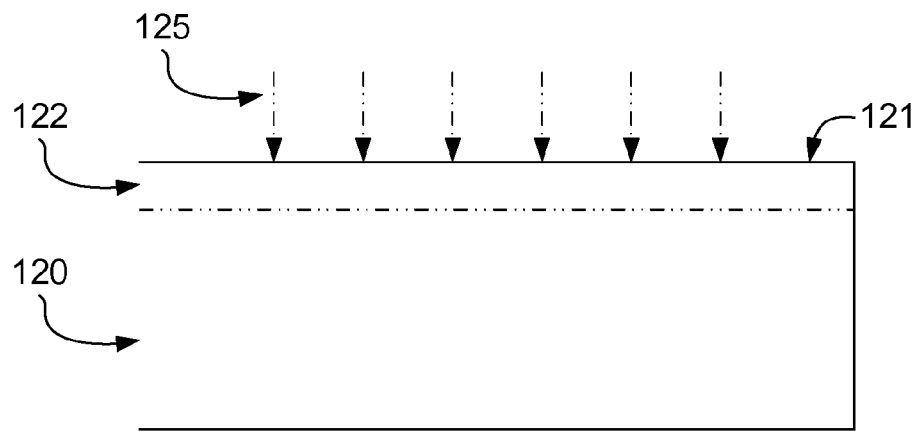
FIGS. 3-5 are block diagrams illustrating intermediate structures formed using a semiconductor-to-glass bonding process in accordance with one or more features disclosed herein.
Figure 4:
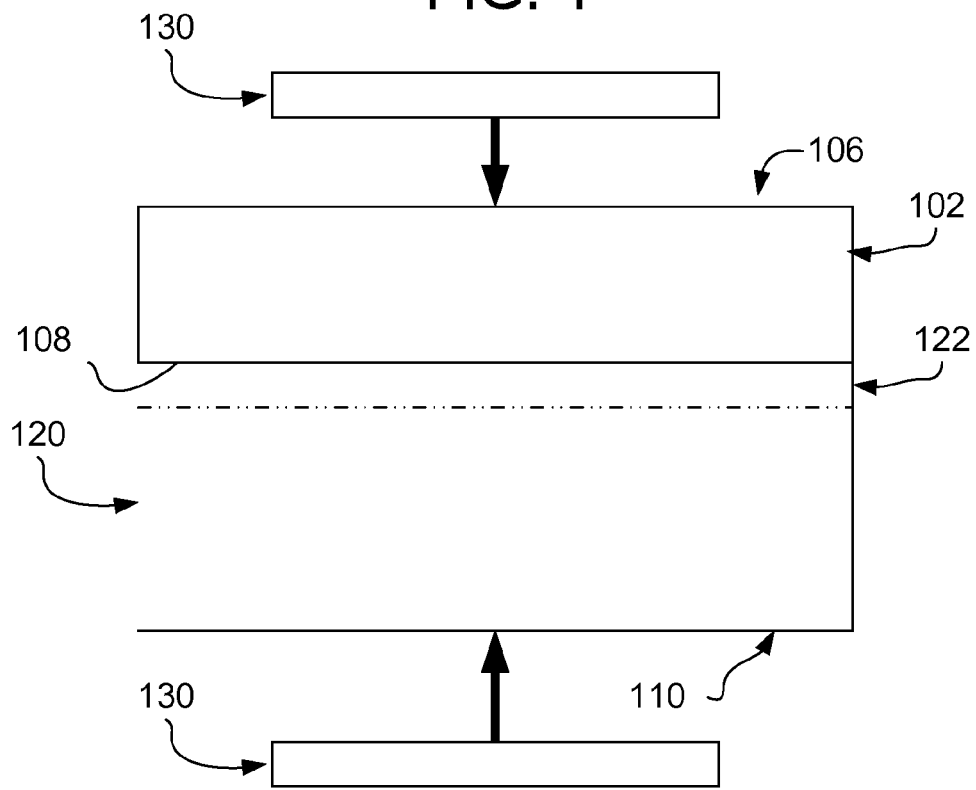
Figure 5:
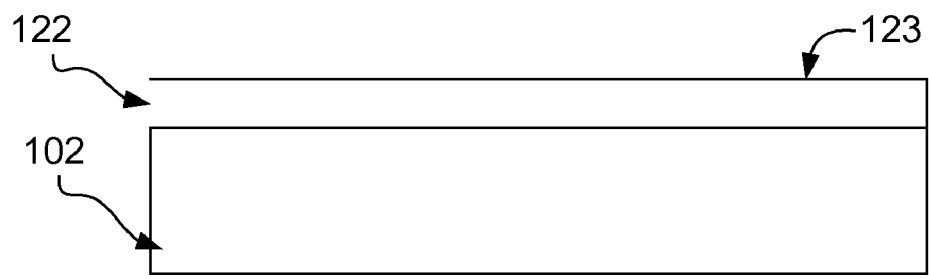

Reference is now made to FIGS. 3-5, which illustrate intermediate structures that may be formed in carrying out the process of manufacturing the SOG structure 100 of FIG. 1 in accordance with one or more aspects of the present invention.

Turning first to FIG. 3, an implantation surface 121 of a donor semiconductor wafer 120 is prepared, such as by polishing, cleaning, etc. to produce a relatively flat and uniform implantation surface 121 suitable for bonding to the glass or glass-ceramic substrate 102. For the purposes of discussion, the semiconductor wafer 120 may be a substantially single crystal Si wafer, although as discussed above any other suitable semiconductor conductor material may be employed.

An exfoliation layer 122 is created by subjecting the implantation surface 121 to one or more ion implantation processes to create a weakened region below the implantation surface 121 of the donor semiconductor wafer 120. Although the embodiments of the present invention are not limited to any particular method of forming the exfoliation layer 122, one suitable method dictates that the implantation surface 121 of the donor semiconductor wafer 120 may be subject to a hydrogen ion implantation process to at least initiate the creation of the exfoliation layer 122 in the donor semiconductor wafer 120. The implantation energy may be adjusted using conventional techniques to achieve a general thickness of the exfoliation layer 122, such as between about 300-500 nm, although any reasonable thickness is within the scope of the invention. By way of example, hydrogen ion implantation may be employed, although other ions 125 or multiples thereof may be employed, such as boron+hydrogen, helium+hydrogen, or other ions known in the literature for exfoliation. Again, any other known or hereinafter developed technique suitable for forming the exfoliation layer 122 may be employed without departing from the spirit and scope of the present invention.

Regardless of the nature of the implanted ion species, the effect of implantation on the exfoliation layer 122 is the displacement of atoms in the crystal lattice from their regular locations. When the atom in the lattice is hit by an ion, the atom is forced out of position and a primary defect, a vacancy and an interstitial atom, is created, which is called a Frenkel pair. If the implantation is performed near room temperature, the components of the primary defect move and create many types of secondary defects, such as vacancy clusters, etc.

With reference to FIG. 3, the glass substrate 102 may be bonded to the exfoliation layer 122 using an electrolysis process (also referred to herein as an anodic bonding process). A basis for a suitable electrolysis bonding process may be found in U.S. Pat. No. 7,176,528, the entire disclosure of which is hereby incorporated by reference. Portions of this process are discussed below; however, one or more embodiments described herein are directed to modifications of the electrolysis bonding process of U.S. Pat. No. 7,176,528.

In the bonding process, appropriate surface cleaning of the glass substrate 102 (and the exfoliation layer 122 if not done already) may be carried out. Thereafter, the intermediate structures are brought into direct or indirect contact to achieve the arrangement schematically illustrated in FIG. 4. The resulting intermediate structure is thus a stack, including the bulk material layer of the donor semiconductor wafer 120, the exfoliation layer 122, and the glass substrate 102.

Prior to or after the contact, the stack of the donor semiconductor wafer 120, the exfoliation layer 122, and the glass substrate 102 is heated 130. Although some electrolysis bonding processes dictate a differential temperature gradient in which the glass substrate 102 is heated to a higher temperature than the donor semiconductor wafer 120 and exfoliation layer 122, embodiments herein focus on alternative and/or additional parameter(s). Specifically, in order to inhibit the formation of particle precipitates on the back surface 106 of the glass substrate 102, at least one of the glass substrate 102 and the semiconductor wafer 120 are heated such that the back surface 106 of the glass substrate 102, opposite to a first surface 108 thereof, is at a lower temperature than the first surface 108. By way of example, the back (second) surface 106 of the glass substrate 102 may be taken to a temperature at least 50° C. lower than the temperature of the first surface 108 thereof, such as between about 50° C. to about 150° C. lower.

FIG. 4 illustrates the application of heat (as well as other conditions 130) to both the second surface 106 of the glass substrate 102 as well as a rear surface 110 of the donor semiconductor wafer 120. In accordance with one aspect, heat plates may be placed in thermal communication with the surfaces 106, 110 of the stack to apply the requisite heat profile. For example, an anodic bonding apparatus suitable for use in applying the temperature and other conditions to the stack is described in co-pending U.S. patent application Ser. No. 11/417,445, filed May 3, 2006, and entitled HIGH TEMPERATURE ANODIC BONDING APPARATUS, the entire disclosure of which is hereby incorporated by reference. When heat plates are applied to both surfaces 106, 110 of the stack, then the heat plate applied to the second surface 106 of the glass substrate 102 may be taken to a lower temperature than the heat plate applied to the rear surface 110 of the donor semiconductor wafer 120 in order to achieve the desired heat profile.

In an alternative embodiment, the stack may be heated from only one side via a heat plate applied to the rear surface 110 of the donor semiconductor wafer 120, without applying a heat plate to the second surface 106 of the glass substrate 102. Although some type of plate may be applied to the second surface 106 of the glass substrate 102 to hold and apply pressure and voltage to the stack, the plate would not be used to apply heat thereto. Under these conditions, the heat applied to the rear surface 110 of the donor semiconductor wafer 120 may be adjusted to achieve the desired thermal difference, where the second surface 106 of the glass substrate 102 is taken to a temperature between about 50° C. to about 150° C. lower than the temperature of the first surface 108 thereof.

The junction of the glass substrate 102 and the donor semiconductor wafer 120 is taken to a temperature sufficient to induce ion migration within the stack and an anodic bond between the exfoliation layer 122 and the glass substrate 102. The temperature is dependent on the semiconductor material of the donor wafer 120 and the characteristics of the glass substrate. By way of example, the temperature of the junction may be taken to within about +/−350° C. of a strain point of the glass substrate 102, more particularly between about −250° C. and 0° C. of the strain point, and/or between about −100° C. and −50° C. of the strain point. Depending on the type of glass, such temperature may be in the range of about 500-600° C. As discussed above, however, it is desirable to limit the temperature on the second surface 106 of the glass substrate 102.

In addition to the above-discussed temperature characteristics, mechanical pressure 130 is applied to the intermediate assembly, which may be applied using the aforementioned (heat) plates. The pressure range may be between about 1 to about 50 psi. Application of higher pressures, e.g., pressures above 100 psi, might cause breakage of the glass substrate 102.

A voltage 130 is also applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. More particularly, positive ions of the glass substrate 102, including substantially all modifier positive ions, migrate away from the higher voltage potential of the donor semiconductor wafer 120, forming: (1) a reduced positive ion concentration layer in the glass substrate 102 adjacent the exfoliation layer 122; and (2) an enhanced positive ion concentration layer of the glass substrate 102 adjacent the reduced positive ion concentration layer.

The intermediate assembly is held under these conditions (pressure, temperature, and voltage 130) for some time, e.g., approximately 1 hr or less. This accomplishes a number of functions: (i) an alkali or alkaline earth ion free interface (or layer) is created in the glass substrate 102 adjacent to the exfoliation layer 122; (ii) an alkali or alkaline earth ion enhanced interface (or layer) is created in the glass substrate 102 adjacent to the alkali or alkaline earth ion free interface; (iii) an oxide layer is created between the exfoliation layer 122 and the glass substrate 102; and (iv) the glass substrate 102 becomes very reactive and strongly bonds to the exfoliation layer 122.

Within the glass substrate 102, the region substantially devoid of mobile ions, but potentially containing network forming ions which are tightly bound in the network, forms as positive ions migrate away from the source of higher voltage potential (i.e., the semiconductor material of the donor wafer 120). The positive ions migrate into a next region of the glass substrate 102, which achieves the enhanced concentration of ions. The remaining layer of the glass substrate 102 is bulk glass. It has been found that such a multilayer barrier layer structure, comprising the semiconductor oxide and the region substantially devoid of mobile ions, is highly thermally stable. The mobile ions in the enhanced region of the glass substrate 102 cannot breach the region substantially devoid of mobile ions, even after extended thermal treatments at elevated temperatures. The thickness of the multilayer barrier is controlled by one or more of the following parameters: temperature (the higher the temperature the faster the ion movement), the magnitude of the applied voltage potential, and time at the temperature and voltage.

The positive ions of the glass substrate 102, which migrate away from the reduced positive ion concentration layer to the enhanced positive ion concentration layer, include at least one alkali/alkaline earth modifier ion. The migration of positive ions results in substantial depletion of all alkali/alkaline-earth ions from the reduced positive ion concentration layer. The alkali/alkaline-earth ions include at least one of: $Li^{+1}$, $Na^{+1}$, $K^{+1}$, $Cs^{+1}$, $Mg^{+2}$, $Ca^{+2}$, $Sr^{+2}$, and/or $Ba^{-2}$. The migration of positive ions results in the reduced modifier positive ion concentration layer including one or more network forming ions.

The barrier functionality (preventing positive ion migration back from the oxide glass or oxide glass-ceramic, through the reduced positive ion concentration layer, and into the semiconductor layer) is desirable in some applications.

With reference to FIG. 5, after the intermediate assembly is held under the conditions of temperature, pressure and voltage for a sufficient time, the voltage is removed and the intermediate assembly is allowed to cool to room temperature. At some point during heating, during a dwell, during cooling, and/or after cooling, the donor semiconductor wafer 120 and the glass substrate 102 are separated. This may include some peeling if the exfoliation layer 122 has not already become completely free from the donor 120. The result is a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

In the example illustrated in FIG. 5, the intermediate structure resulting from the electrolysis process includes, in order: a bulk glass substrate (in the glass substrate 102); the enhanced alkali or alkaline earth ion layer adjacent to the bulk glass substrate (but still within the glass substrate 102); the reduced alkali or alkaline earth ion layer adjacent to the enhanced alkali or alkaline earth ion layer (but still within the glass substrate 102); the oxide layer; and the exfoliation layer 122.

The cleaved surface 123 of the SOG structure, just after exfoliation, may exhibit surface roughness, excessive silicon layer thickness, and/or implantation damage of the silicon layer (e.g., due to the formation of an amorphized silicon layer). Depending on the implantation energy and implantation time, the thickness of the exfoliation layer 122 may be on the order of about 300-500 nm, although other thicknesses are within the scope of the invention. These characteristics may be altered using post bonding processes.

In a first example, a silicon donor wafer was implanted with hydrogen ions to create an exfoliation layer therewithin. The silicon donor wafer was placed in contact with a 0.6 mm thick glass substrate containing alkaline-earth ions (Corning Incorporated EAGLE 2000® Glass). The stack was then introduced into an anodic bonding apparatus capable of applying temperature, pressure and voltage sufficient to induce anodic bonding. The temperature of the backside of the glass substrate was elevated above the temperature of the silicon side by 50° C. However, the overall bonding temperature was reduced to 350° C. on the silicon wafer side and to 400° C. on the glass side. At such temperature conditions, ionic conduction through the 0.6 mm glass is just barely measurable. Bonding under these conditions notably reduced the presence of backside particles; however, the approach exhibited an undesirable consequence of extending the cycle time for barrier layer formation at the silicon-glass interface from a few minutes to over one hour, due to the lower ionic conductivity.

Figure 6:
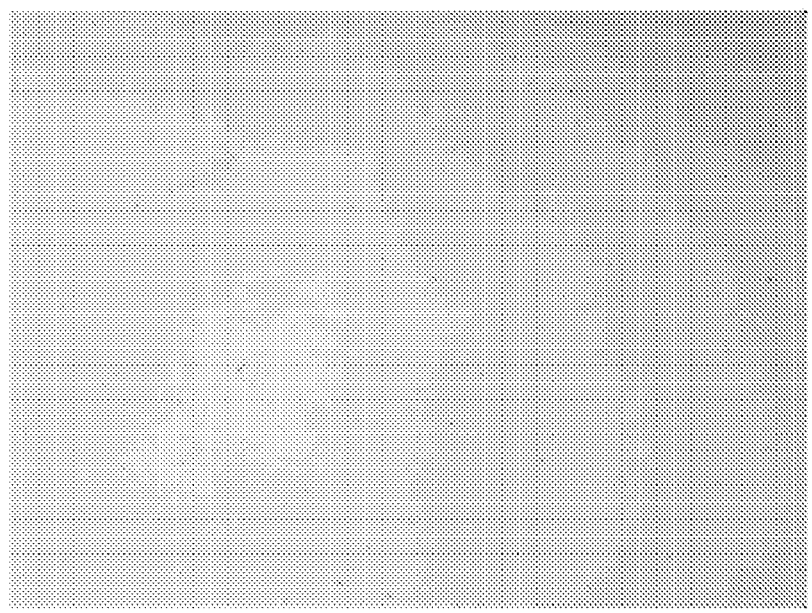
FIG. 6 is an illustration of a backside of the glass substrate of an SOG on which particle precipitates have not formed due to an improved fabrication process.

In another example, the conditions of the first example were repeated, with the following exception: the temperature gradient was reversed. The temperature of the silicon side of the stack was elevated to a temperature of about 500° C., while the temperature of the back side of the glass substrate was limited to about 360° C. The higher silicon temperature enabled high ion mobility at the silicon-glass interface, allowing the barrier layer to form, while the cooler backside glass temperature limited ion mobility, thereby preventing sodium migration. A micrograph (using an optical microscope image of 50×) of the back surface of the glass substrate is shown in FIG. 6. It can be seen that the backside particles are greatly reduced, with minimal impact to the anodic bonding process.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor on glass structure, comprising:
bringing a first surface of a glass substrate into direct or indirect contact with a semiconductor wafer;
heating at least one of the glass substrate and the semiconductor wafer such that a second surface of the glass substrate, opposite to the first surface thereof, is at a lower temperature than the first surface;
applying a voltage potential across the glass substrate and the semiconductor wafer; and
maintaining the contact, heating and voltage to induce an anodic bond between the semiconductor wafer and the glass substrate via electrolysis; and wherein:
the semiconductor wafer is a donor semiconductor wafer, and the method further comprises:
subjecting an implantation surface of the donor semiconductor wafer to an ion implantation process to create an exfoliation layer of the donor semiconductor wafer;
bringing the first surface of the glass substrate into direct or indirect contact with the implantation surface of the donor semiconductor wafer, prior to the heating and voltage steps to induce an anodic bond between the implantation surface of the donor semiconductor wafer and the glass substrate via electrolysis; and
subsequent to the maintaining step, removing the voltage potential across the glass substrate and the semiconductor wafer and then, subsequent to the voltage removal step, separating the glass substrate and semiconductor wafer;
wherein the 0-300° C. average coefficient of thermal expansion (CTE) of the glass substrate is less than $32 \times 10^{-7}/°C$.

2. The method of claim 1, wherein the heating step includes heating at least one of the glass substrate and the semiconductor wafer such that the second surface of the glass substrate is at temperature at least 50° C. lower than the temperature of the first surface of the glass substrate.

3. The method of claim 2, wherein the second surface of the glass substrate is at temperature between about 50° C. to about 150° C. lower than the temperature of the first surface of the glass substrate.

4. The method of claim 1, wherein the heating step includes heating a junction of the first surface of a glass substrate and the semiconductor wafer to a temperature between about +/−350° C. of the strain point of the glass substrate.

5. The method of claim 4, wherein the junction of the first surface of a glass substrate and the semiconductor wafer is heated to a temperature between about −250° C. and 0° C. of the strain point of the glass substrate.

6. The method of claim 5, wherein the junction of the first surface of a glass substrate and the semiconductor wafer is heated to a temperature between about −100° C. and −50° C. of the strain point of the glass substrate.

7. The method of claim 1, wherein the heating step includes applying a source of heat to the semiconductor wafer, but not applying a source of heat to the second surface of the glass substrate.

8. The method of claim 1, wherein the donor semiconductor wafer is taken from the group consisting of: silicon (Si), germanium-doped silicon (SiGe), silicon carbide (SiC), germanium (Ge), gallium arsenide (GaAs), GaP, and InP.

9. The method of claim 1, wherein the method further comprises applying a pressure of from about 1 psi to about 50 psi to the glass substrate and the semiconductor wafer.

* * * * *